United States Patent
Rabjohn et al.

(10) Patent No.: US 7,702,301 B2
(45) Date of Patent: *Apr. 20, 2010

(54) METHOD AND APPARATUS FOR DISTORTION CORRECTION OF RF AMPLIFIERS

(75) Inventors: Gordon G. Rabjohn, Ottawa (CA); Johan Grundlingh, Kinburn (CA)

(73) Assignee: Sige Semiconductor Inc., Ottawa, Ontario (CA)

( * ) Notice: Subject to any disclaimer, the term of this patent is extended or adjusted under 35 U.S.C. 154(b) by 506 days.

This patent is subject to a terminal disclaimer.

(21) Appl. No.: 11/806,125

(22) Filed: May 30, 2007

(65) Prior Publication Data
US 2008/0297247 A1    Dec. 4, 2008

(51) Int. Cl.
*H01Q 11/12* (2006.01)

(52) U.S. Cl. .............. 455/126; 455/114.3; 455/115.1; 455/115.3; 455/127.1; 455/127.3; 455/91; 455/550.1; 455/67.11; 455/67.13; 375/269; 375/294; 375/295; 375/296; 375/297; 330/110; 330/149; 330/151; 330/259; 330/279

(58) Field of Classification Search ............... 455/108, 455/110, 113, 114.3, 115.1–115.3, 126, 127.2, 455/127.1, 91, 550.1, 67.11, 67.13; 375/269, 375/294, 295, 296, 297; 330/110, 149, 151, 330/259, 279, 86

See application file for complete search history.

(56) References Cited

U.S. PATENT DOCUMENTS

| | | | | | |
|---|---|---|---|---|---|
| 4,276,514 | A | * | 6/1981 | Huang | 330/149 |
| 5,485,120 | A | * | 1/1996 | Anvari | 330/151 |
| 6,133,789 | A | * | 10/2000 | Braithwaite | 330/149 |
| 6,853,836 | B2 | * | 2/2005 | Asam et al. | 455/126 |
| 6,970,684 | B2 | * | 11/2005 | Haapakoski | 455/115.1 |
| 7,064,608 | B2 | * | 6/2006 | Ascarrunz et al. | 330/151 |
| 7,409,004 | B2 | * | 8/2008 | Booth et al. | 375/295 |
| 7,466,195 | B2 | * | 12/2008 | Drogi et al. | 330/136 |
| 2004/0104773 | A1 | * | 6/2004 | Ascarrunz et al. | 330/149 |

* cited by examiner

*Primary Examiner*—Edward Urban
*Assistant Examiner*—Junpeng Chen
(74) *Attorney, Agent, or Firm*—Freedman & Associates

(57) ABSTRACT

A method of reducing distortion in the output of an amplifier is provided. The method comprises subtractively combining an error signals with the appropriate phase shift with input signals to be amplified. The error signal being generated by subtractively combining a fed-forward portion of the input signal with a portion of the fed-back amplified output signal, and signal processing applied to it between its generation and application to correcting the input signal in the baseband domain. The error therefore being down-converted, filtered, and up-converted in the feedback path. The filtered baseband error signal components providing inputs to a controller which adjusts active elements of the amplification and feedback path in order to minimize the distortion within the output of the amplifier.

33 Claims, 6 Drawing Sheets

METHOD AND APPARATUS FOR DISTORTION CORRECTION OF RF AMPLIFIERS

FIELD OF THE INVENTION

The invention relates to microwave amplifiers, and more specifically to correcting distortion generated in microwave amplifiers.

BACKGROUND OF THE INVENTION

In recent years, advances in semiconductor integrated circuits for wireless and RF technology have dramatically changed our perceptions, use, and reliance upon portable electronic devices. The uses of wireless technology are widespread, increasing, and include, but are not limited to, telephony, Internet e-mail, Internet web browsers, global positioning, photography, diary, address book, and in-store navigation. Additionally, devices incorporating wireless technology have expanded to include not only cellular telephones, but Personal Digital Assistant (PDAs), laptop computers, palmtop computers, gaming consoles, printers, telephone headsets, portable music players, point of sale terminals, global positioning systems, inventory control systems, and even vending machines. Today, many of these devices are high volume consumer commodities supplied by businesses competing through integrated features and rapidly changing branding whilst reinforcing customers desire for small size, long battery life, and lightweight devices with increased roaming capabilities and download speeds. Within a matter of a few years, these systems have evolved from bulky cellular telephones offering voice and simple text messaging to lightweight compact multi-media players providing streaming live video and music alongside telephony, PDA functionality, integrated mega pixel CCD camera, and supporting BlueTooth™ wireless peripheral interfaces for headphones, microphones etc.

Semiconductor integrated circuits have been an important enabler of this rapid evolution by offering high volume, low cost solutions with low power consumption, small footprint and reduced component count when compared to discrete or hybrid solutions. There is significant economic and business pressure to ensure that these trends continue, whilst providing increased benefits to the manufacturers including reducing the number of chips for a chip set, providing multiple standards from a single chip set, and providing specifications and margin allowing today's chip sets to support the evolving bandwidth and spectral aspects of these systems and standards.

Indeed, such wireless semiconductor circuits today address a plethora of standards including, but not limited to, IEEE 802.11 WiFi, IEEE 802.16 WiMAX, quad-band GSM, EDGE, GPRS, and Global Positioning Systems. In many instances, such as IEEE 802.16e WiMAX with targeted data rates of 10 Mb/s at a 10 km range from a base station, the systems are also stretching the limits of performance in respect of transmitted power, received power, dynamic range, interference, efficiency and bandwidth.

All of these performance aspects impact the design and implementation of the RF amplifiers that form a critical element in both the transmitter and receiver portions of the transceivers within these devices. In order to increase efficiency wireless amplifiers have tended to move from the high linearity amplifier design typified by classes A, AB, and B, (http://en.wikipedia.org/wiki/amplifier) to non-linear amplifier classes such as C, D, E and F, where efficiencies over 90% can be achieved.

The evolution from low efficiency, high linearity amplifiers to very high efficiency non-linear amplifiers has circuit designers exploiting classical techniques to correct the distortion generated in the amplifier. For those skilled in the art such classical techniques fall into 5 different classes; feed-forward, feedback, pre-distortion, adaptive bias, and synthesis. However, the basic objective on any amplifier in the context of a wireless information transmission system is to provide an exact copy of the signal intended to be transmitted at the correct power level with highest possible power efficiency.

Feed-Forward: This approach employs an error signal that is extracted from an amplifier, commonly referred to as the power amplifier (PA) on the transmit path. Considering a PA for the following discussions, then the PA is corrected by subtracting a scaled (attenuated) version of the output signal of the PA from the input signal. If these signals are properly scaled, then the resulting signal contains only error information that is spectral energy generated by the non-linearity of the PA, noise from the PA, and energy resulting from non-flat frequency response of the PA, and none of the original signal. This error signal is then amplified appropriately, and subtracted from the output signal of the PA. Typically, the output signal from the amplifier is time delayed to account for the delay in the components of the error signal generation path. An example of the feed-forward approach is disclosed by Chen et al in "Article comprising a Power Amplifier with Feed Forward Linearizer using a RLS Parameter Tracking Algorithm" (U.S. Pat. No. 5,963,091) and described in respect of FIG. 1 subsequently. If the amplitude and phase are correct, feeding forward and subtracting the error removes all the error (distortion) generated in the PA in question and is powerful in that the approach corrects any error generated by the PA. However, it is a very inefficient correction technique as firstly, the amplifier boosting the error signal must itself be fairly large and linear as its output signal is generally combined with the PA output signal using a low ratio coupler to avoid losses on the main transmit path. Secondly, the time delay applied to the output signal of the PA due to the circuit delay in the error signal path can add significant loss.

Pre-Distortion: This correction approach employs a model of the PA to predict the distortion that will be generated in the amplifier being corrected. The modeled distortion is then added to the input signal provided to the amplifier, with appropriate phase adjustment, such that it cancels the distortion produced. The model can take many forms including, but not limited to, a look-up table of amplitude modulation (AM) and phase modulation (PM) transfer curves such as AM-AM and AM-PM curves, it can be non-linear electronic hardware, it can be DSP algorithms, or it can be a scaled model of the amplifier being corrected. An example of pre-distortion applied to an amplifier is presented by Midya et al "Scalar Cost Function based Pre-Distortion Device, Method, Phone and Base Station" (U.S. Pat. No. 6,240,278), as presented and discussed in respect of FIG. 2.

Pre-distortion is an efficient technique, in that there are no lossy circuit elements after the power amplifier, and there are no additional microwave circuit blocks that are inherently power-hungry. Further, the ability to use digital hardware, which has dramatically improved in capability in recent years, has made this a favored solution. However, predistortion can only easily cope with simple memoryless deterministic distortion and typically assumes that the AM-AM and AM-PM curves are static and do not depend on earlier events, operational conditions, or frequency of operation. Furthermore, the nature of the model used to predict the error must suit the amplifier. That is, the model must employ an appropriate order of non-linearity, or an appropriate number of entries in the look-up table.

This makes the pre-distortion system somewhat specific to the amplifier being corrected. Although digital hardware tends to be relatively low cost, a digital pre-distorter can be quite elaborate, requiring wide data bus and fast sample rates (usually at least 5× the Nyquist rate of the data rate within the uncorrected signal). Finally, the algorithms for adjusting the non-linearity (the weights on the non-linear work function or the elements in the look-up table) are complex and prone to finding local minima. Despite these limitations and disadvantages, pre-distortion has a significant share of the distortion correction solutions implemented today.

Adaptive Bias: In contrast to the previous approaches, adaptive bias technique does not attempt to correct distortion products but rather can improve either the linearity or minimize the distortion of the PA. In an adaptive bias system, the bias voltages on the terminals of the active device are adjusted to suit the instantaneous signal being transmitted. For example, the collector or drain voltage of a transistor amplifier can be increased during peaks in the amplitude of the input signal. This technique can be a simple way to make modest improvements to amplifier linearity, however it also is amplifier dependant, and large improvements in linearity are difficult to achieve. As a result, the adaptive bias approach has limited benefit to the very high efficiency but highly non-linear amplifier classes which suit the demands for low power consumption in wireless handheld devices.

Synthesis: This approach is more a general category of "synthesis techniques", in which a linear PA is not used, but instead the signal at the output port of the amplification system is generated by combining 2 or more signals, each of the initial signal components not resembling the final signal being generated. Examples of this technique include Envelope Elimination and Restoration (EE&R), as discussed by Midya, Khan et al "Method, Device, Phone and Base Station for Providing Envelope-Following for Variable Envelope Radio Frequency Signals" (U.S. Pat. No. 6,141,541), and Linear Amplification with Nonlinear Components (LINC), as discussed by Okubo et al "Constant-Amplitude Wave Combination Type Amplifier" (U.S. Pat. No. 5,287,069).

In EE&R, a constant amplitude signal with variable phase is amplified, and the envelope restored by varying the collector or drain voltage of the transistor amplifier. In LINC, two constant amplitude signals are combined in various phases to generate a signal with the correct amplitude and phase. These techniques have specific applications, but all have significant drawbacks in respect of power, bandwidth, efficiency and linearity.

Feedback: The general technique of feedback correction goes back nearly 80 years, see for example H. S. Black "Wave Translation System" (U.S. Pat. No. 2,102,671; filed 1932). In particular, negative feedback tends to act to reduce variability of gain, and reduces distortion introduced in an amplifier. The actual feedback may be implemented in many different forms. Perhaps the simplest form of feedback being referred to as circuit-level feedback, wherein an electrical linkage couples some of the energy from the output port of an amplifier back to the input port. Considering a single transistor amplifier, such approaches include shunt-feedback, where a resistor is placed between the drain and gate of a transistor, and series feedback, where an inductor is inserted into the source of a transistor.

Circuit level feedback can be applied to multiple stages, but the signal delay through the stages must be accounted for. If there is too much delay, then the negative feedback will, at some frequency, become positive feedback, and an oscillation results because a portion of the output signal (at a particular set of frequencies) adds constructively to the input signal. With each passage through the loop, the signal increases to the point where all energy can be found in those particular frequencies where the combination is most constructive. Of course, as long as the gain is less than unity at the frequency at which the phase shift through the feedback loop is 360 degrees, the amplifier will remain stable. While simple circuit level feedback is widely used it suffers from one major fault in that it necessarily decreases the gain of the amplifier. Hence, higher levels of correction necessarily increasing gain which is an issue at RF frequencies where gain is difficult and expensive to achieve.

As a result, other feedback approaches have been established to act upon only the information on the envelope of the signal being amplified, which has the advantages that the RF gain of the amplifier is undiminished, and the feedback circuit may be implemented in baseband. Two such approaches being Cartesian Feedback and Polar Feedback. Considering, Cartesian Feedback, a typical approach is presented by Leitch "Gain/Phase Compensation for Linear Amplified Feedback Loop" (U.S. Pat. No. 4,933,986), in demodulating the signal at the output port of the amplifier into in-phase (I) and out-of-phase (Q) components in the Cartesian coordinate system. These I- and Q-output signal components can be compared to the I-and Q-input signals, and the results applied to an I/Q modulator at the input port of the amplifier to provide correction.

An advantage of the Cartesian feedback approach is that the filtering that keeps the amplifier stable can now be done at baseband, which is advantageous, as it no longer needs to be tuned with the RF frequency of operation of the amplifier. The design of this filter is critical, however, as the filter's frequency response is superimposed onto the gain of the amplifier. Further, delay through the amplifier is critical, as it determines the bandwidth of the filter required to stabilize the feedback loop, and therefore the instantaneous bandwidth of the system.

In contrast, Polar feedback resolves the amplitude and phase elements of the output signal, compares these to the amplitude and phase characteristics of the input signal, and uses the resulting error terms to control a polar modulator placed before the input port of the power amplifier, thereby closing the loop. This approach is presented subsequently in FIG. 4. Both Cartesian and Polar feedback techniques suffer from the limitations of the loop filter that is used to ensure that the gain of the loop rolls off fast enough with increasing frequency such that the loop remains stable. In the prior art, this loop filter adds delay and amplitude variation with frequency across the band.

It is possible, however, to configure feedback loops in which just the error is fed back, such an approach being presented by Huang "Wideband, Phase Compensated Amplifier with Negative Feedback of Distortion Components in the Output Signal" (U.S. Pat. No. 4,276,514). This approach generates the error term by subtracting the input signal from the attenuated version of the output signal. This error term is fed back into the input port of the amplifier in anti-phase (inverted) to effect the correction. This is advantageous, as the frequency response of the filter is now interposed only on the error signal and the main signal is not at all affected. Ripple in the frequency response of this filter will vary the amount of correction applied, but not the gain of the main signal. Implementations of error feedback have been limited, primarily as initial publications on error feedback, such as John McRory "An RF Amplifier for Low Intermodulation Distortion" (1994 MTT-S Digest, pp. 1741-) resulted in minimal improvements being observed. Two significant challenges in implementing this architecture exist. Firstly, the implementation of the tunable filter which must be at RF, but have a finesse adequately high to maintain stability, and secondly in designing the components in the loop to have minimal delay so that a useful correction bandwidth results.

The classical techniques presented supra all suffer from one or more of the following impairments:
  Poor Efficiency
  Limited Bandwidth
  Complexity
  Limited Effectiveness It would be apparent that such limitations result in system designers and circuit designers trading aspects of performance and cost in implementing commercial systems with non-linear amplifiers for improved efficiency using these prior art approaches.

It would therefore be advantageous to provide a linearization solution for an RF amplifier that addresses these drawbacks of prior art approaches whilst leveraging increased integration potential within semiconductor integrated circuits for lowering cost, footprint and power consumption. It would be particularly beneficial if the linearization solution addressed the increasing fractional bandwidth of today's increasing data rate wireless protocols.

SUMMARY OF THE INVENTION

In accordance with the invention there is provided a method comprising amplifying an applied RF input signal to generate an RF output signal with an amplifier, generating an error signal by combining a predetermined portion of the RF output signal with a predetermined portion of a supplied RF input signal, and modifying the error signal to generate a modified error signal, the modified error signal generated by down-converting the error signal, processing the down-converted error signal and up-converting the processed down-converted error signal. The method further comprising reducing distortion in the RF output signal by combining the modified error signal with the supplied RF input signal to provide the applied RF input signal, and controlling an aspect of at least one of the generation of the modified error signal, generation of the error signal, and the applied RF input signal at least in dependence upon a magnitude of the down-converted error signal.

In accordance with another exemplary embodiment of the invention there is provided a circuit comprising an amplifier for amplifying an applied RF input signal to generate an RF output signal, and an error signal circuit for generating an error signal by combining a predetermined portion of the RF output signal with a predetermined portion of a supplied RF input signal. The circuit further comprises an error signal modification circuit for modifying the error signal to generate a modified error signal, the modified error signal generated by down-converting the error signal, processing the down-converted error signal and up-converting the processed down-converted error signal, and an error combiner circuit for reducing distortion in the RF output signal by combining the modified error signal with the supplied RF input signal to provide the applied RF input signal. The circuit further comprises a controller for controlling an aspect of at least one of the generation of the modified error signal, generation of the error signal, and the applied RF input signal at least in dependence upon a magnitude of the down-converted error signal.

In accordance with another exemplary embodiment of the invention there is provided a method comprising the steps of amplifying a microwave signal with at least an amplifier to provide an output signal, the output signal being substantially an amplified replica of the microwave signal, and the step of providing an input signal, the input signal forming a portion of the microwave signal to be amplified. The method further comprising the steps of extracting a predetermined portion of the output signal, and the step of combining a predetermined portion of the input signal with the predetermined portion of the output signal to form an error signal, the error signal substantially suppressing the input signal component and substantially unaffecting distortion components of the output signal.

The method further comprises the step of down-converting the error signal according to a predetermined coordinate system to provide down-converted error components, and the step of processing the down-converted error components to provide modified down-converted error components, and the step of up-converting the modified down-converted error components according to the predetermined coordinate system to provide a modified error signal. Further the method comprises the step of combining the modified error signal with the input signal to form the microwave signal and provide a reduction in the distortion components of the output signal, and the step of providing at least a control signal, the control signal being one of a plurality of control signals, each control signal for controlling an aspect of at least one of steps (a) through (h) and being determined in dependence upon a measure of one of the down-converted error components and modified down-converted error components.

In accordance with another exemplary embodiment of the invention the method further comprises providing an electrical circuit, and providing a first predetermined portion of the electrical circuit as portion of a first integrated circuit, and providing a second predetermined portion of the electrical circuit as a portion of a second integrated circuit. The method further comprises the step of assembling the first and second integrated circuits, the assembly minimizing the time delay from the amplifier output port to the amplifier input port.

In accordance with another exemplary embodiment of the invention there is provided a method further comprises providing an electrical circuit, providing a first predetermined portion of the electrical circuit as a portion of a first circuit package, and providing a second predetermined portion of the electrical circuit as a portion of a second circuit package. The method further comprising assembling the first and second circuit packages, the assembly reducing the time delay from the amplifier output port to the amplifier input port.

In accordance with another exemplary embodiment of the invention the method comprises providing predetermined portions of an electrical circuit implementing the method as portions of circuit packages, wherein providing the portions of the circuit packages comprises placing each respective portion of the electrical circuit within a circuit package thereby reducing the time delay associated with that portion of the electrical circuit and its respective circuit package.

BRIEF DESCRIPTION OF THE DRAWINGS

Exemplary embodiments of the invention will now be described in conjunction with the following drawings, in which.

DETAILED DESCRIPTION OF EMBODIMENTS OF THE INVENTION

Figure 1:
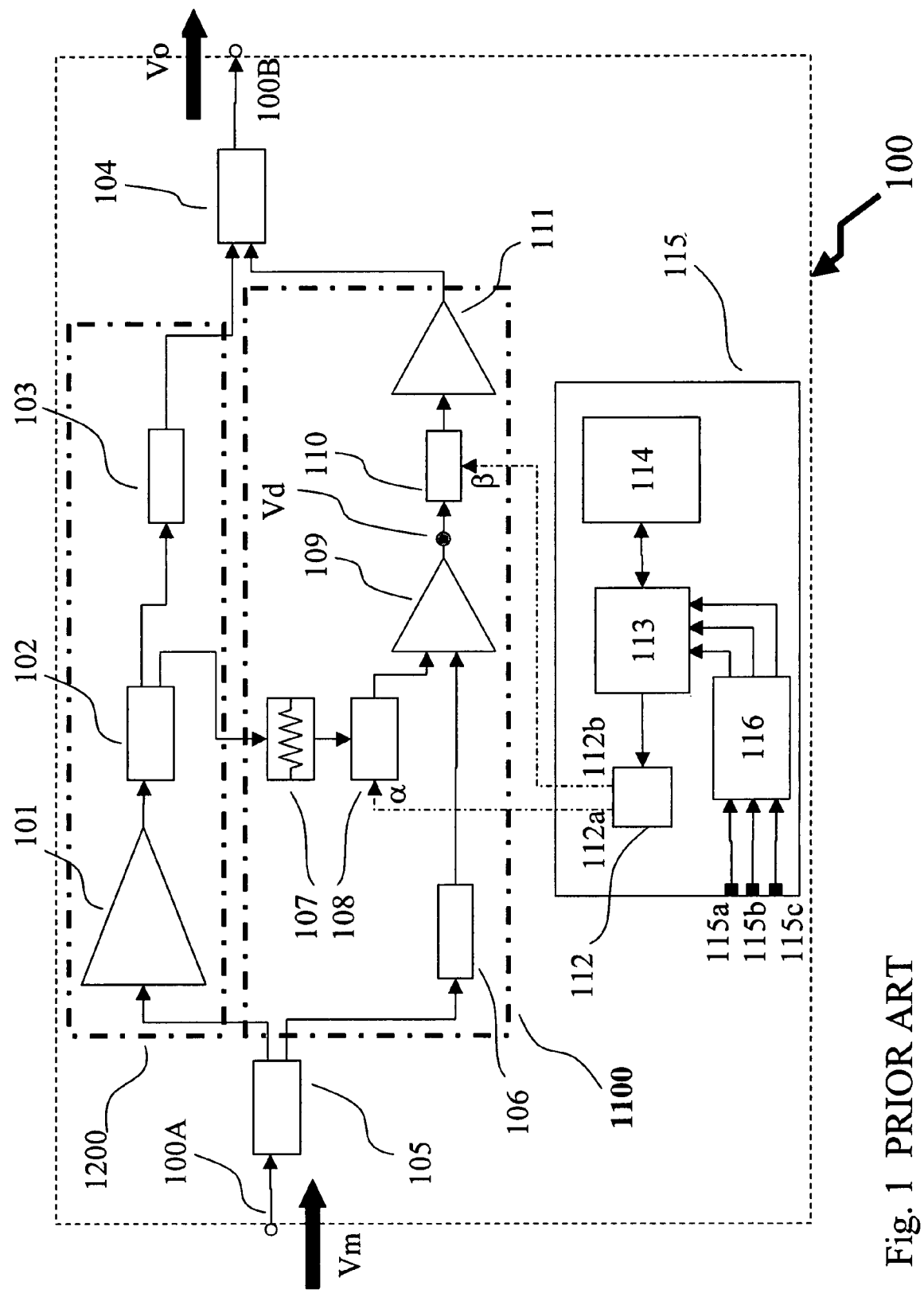
FIG. 1 illustrates an exemplary feed-forward distortion correction approach according to the prior art.

Shown in FIG. 1 is an exemplary feed-forward amplifier system 100 according to Chen et al (U.S. Pat. No. 5,963,091). As shown, the feed-forward distortion correction system 100 comprises an RF input port 100A which receives an RF modulated signal Vm which is to be amplified, and provided as an amplified linear replica at the output port 100B as amplified signal Vo.

The RF input port 100A is electrically coupled to the input splitter 105 which taps a predetermined portion of the RF modulated signal Vm to feed forward into the correction signal path 1100, and couples the remaining RF modulated signal Vm into the main arm 1200. The main arm 1200 couples the RF modulated signal Vm from the input splitter 105 to the power amplifier 101 which amplifies the RF modulated signal Vm as required by the overall system. The feed-forward amplifier system 100 provides amplification, that is required, for example in the transmit path of a wireless WiMAX transceiver embedded into a portable device. The output signal from the power amplifier 101 is coupled to a signal splitter 102 wherein a predetermined portion of the amplified signal is tapped and coupled to the correction signal path 1100 by virtue of being electrically coupled to the attenuator 107. The remaining output port from the signal splitter 102 is then electrically coupled to a first delay element 103 and thence to cancellation adder 104 before being electrically connected to the RF output port 100B.

The portion of the RF modulated signal Vm split from the input splitter 105 and provided to the correction signal path 1100 is initially coupled to a second delay element 106 before being coupled the first port of the adder circuit 109. The second port of the adder circuit 109 is coupled to the cancellation vector modulator 108 that receives the attenuated portion of the amplified RF signal from the attenuator 107. In this manner, the adder circuit 109 receives a time-delayed replica of the RF modulation signal Vm and a replica of the amplified signal from the power amplifier 101. As such, with appropriate control of the attenuator 107 and cancellation vector modulator 108, the portions of each replica signal being of equal magnitude and out of phase such that the adder circuit 109 provides an output signal which is solely the error introduced by the power amplifier 101, Vd.

This error signal Vd is then electrically coupled to a cancellation error vector modulator 110 and auxiliary amplifier 111, the output port of the auxiliary amplifier 111 being coupled to the other input port of the cancellation adder 104. In a similar manner to the attenuator 107 and cancellation vector modulator 108, the intent with the cancellation error vector modulator 110 and auxiliary amplifier 111 is provide an error signal of equal magnitude to the error signal components within the main arm 1200 from the power amplifier 101, and one phase shifted such that when added to the amplified RF modulated signal within the cancellation adder 104 the error signal is cancelled, resulting in an output RF signal Vo which is a highly linear, amplified replica of the RF modulation signal Vm.

A digital signal processor 115 is configured to receive input signals determined in dependence upon the RF modulation signal Vm, output RF signal Vo and error signal Vd at its control input ports 115a through 115c. These are down-converted using down-converter circuit 116, which is configured to shift the frequency range of the signals, Vm, Vd, and Vo into the baseband frequency range. These down-converted signals are then coupled to the digital signal processor (DSP) 113, which performs the necessary calculations to determine appropriate control signals to elements of the correction signal path 1100. The DSP 113 is also in communication with memory device 114 which provides data to the DSP 113. The DSP 113 provides data to the D-A converter 112, which has two DAC output ports 112a and 112b. The D-A converter 112 converts calculated parameters for the correction factors to first analog signal $\alpha$ that is coupled to the cancellation vector modulator 108 from DAC output port 112a, and second analog signal $\beta$ that is coupled to the cancellation error vector modulator 110. The DSP 113 thereby monitors the RF output signal Vo, and determines adaptions to the first and second analog signals $\alpha$ and $\beta$.

Feed-forward correction is a powerful technique, in that it corrects any error generated by the power amplifier 101. However, the correction generated and fed forward by correction signal path 1100 must be amplified to the same power level as that of the power amplifier 101. As a result, the auxiliary amplifier 111 is typically a fairly large amplifier due to the typically low split ratio of the cancellation adder 104. This results in high power consumption. Additionally, the auxiliary amplifier must be an amplifier of high linearity as it is amplifying the correction signal, and is itself uncorrected.

Figure 2:
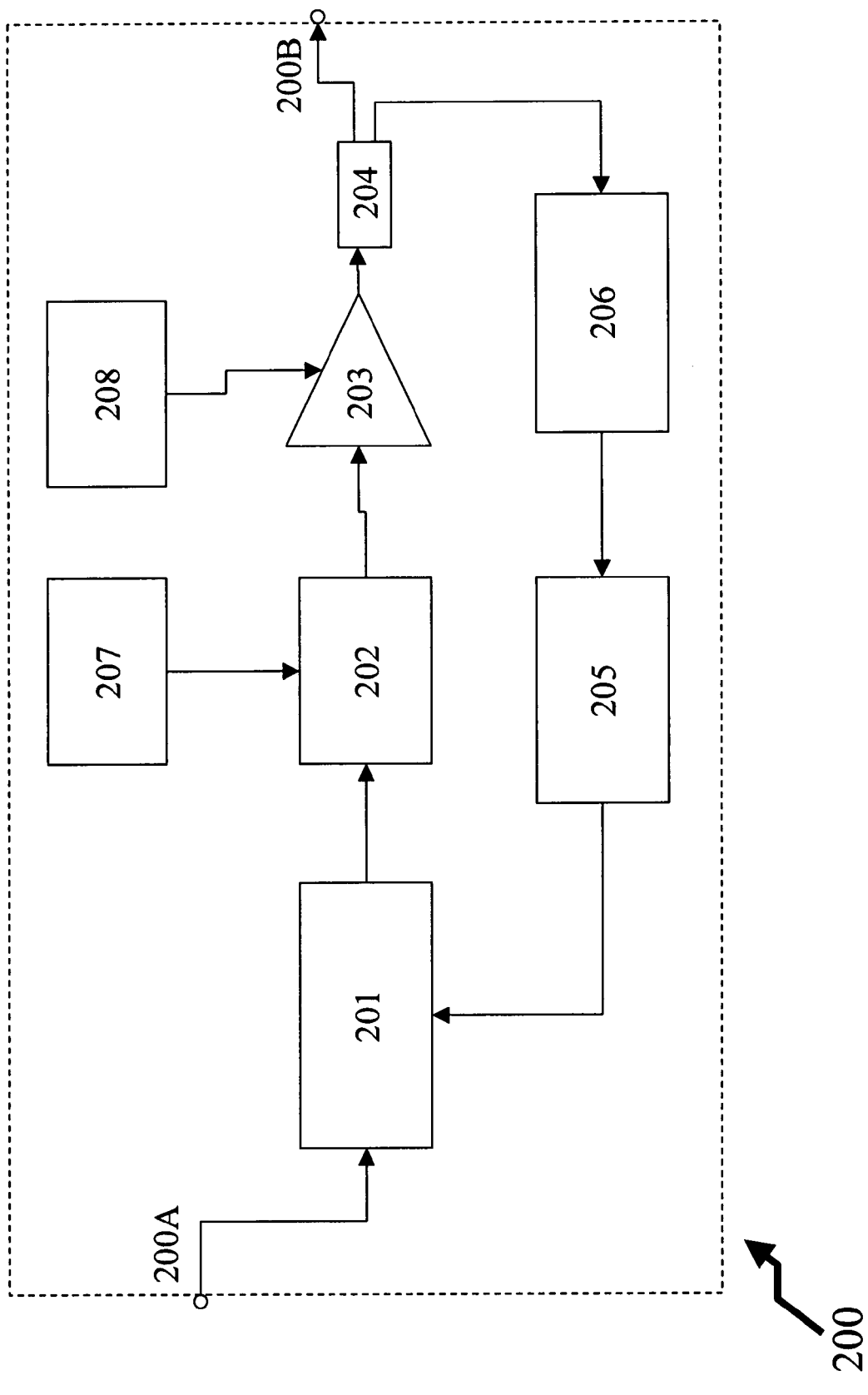
FIG. 2 illustrates an exemplary DSP based pre-distortion correction approach according to the prior art.

Referring to FIG. 2 shown is an exemplary DSP pre-distortion amplifier circuit 200 according to Midya et al (U.S. Pat. No. 6,240,278). Accordingly shown is an input port 200A which receives a baseband signal to be amplified (I+jQ) which is electrically connected to a polynomial pre-distortion unit 201, the output signal of which is a predistorted baseband signal (I'+jQ') applied to the input port of a RF modulator 202 which translates the predistorted baseband signal to an RF input signal and couples this to the input port of the power amplifier 203. The output port of the power amplifier 203 is electrically coupled to the output port 200B via a splitter 204. The power amplifier 203 is biased from the power supply 208.

The tapped portion of the amplified RF signal from the splitter 204 is electrically coupled to a scalar function generator 206, which computes a scalar out-of-band-energy function and provides this to the coefficient update unit 205. The scalar function generator 206 comprising at least an RF mixer, not shown for clarity, to convert the RF output signal to baseband for digital processing. The coefficient update unit 205 determines whether any tuning of the polynomial coefficients applied by the polynomial pre-distortion unit 201 is required, the coefficients being determined to minimize the scalar out-of-band-energy function to provide a linear amplified RF signal.

As taught by Midya et al the polynomial pre-distortion unit 201 pre-distorts the applied baseband signal using the third and fifth order terms of the non-linear component of the output signal from the amplifier, referred to as p3 and p5 respectively, which are the products of the complex baseband signal and the predetermined scalar function of the power transfer characteristic of the power amplifier 203. These terms are shown below in Eq. 1 and Eq. 2 respectively.

$$p3(I,Q)=(I+jQ)\{(I^2+Q^2)\}; \text{ and} \quad [1]$$

$$p5(I,Q)=(I+jQ)\{(I^2+Q^2)^2\} \quad [2]$$

These predetermined terms of the power series are weighted to adjust according to the given power amplifier 203, the power series coefficient weights ($w_k$) being complex. This accounts for the amplitude modulation (AM) and phase modulation (PM) nonlinearity as well as the AM-AM nonlinearity correction from the real part of the coefficients. Thus the predistortion may have the format presented below in Eq. 3.

$$(I'+Q')=(I+jQ)+w_3p_3+w_5p_5 \quad [3]$$

It is these power series coefficient weights ($w_k$) as a series of polynomial coefficients that are provided from the coefficient update unit 205 to the polynomial pre-distortion unit 201. It would be evident therefore that the polynomial pre-distortion approach requires detailed evaluation of the power amplifier 203 and derivation of the appropriate polynomial series for the correction. Hence, whilst the approach employs solely baseband digital processing, the approach does not easily account for aging effects within the power amplifier that would render the existing coefficients less than optimal in reducing distortion. Whilst the power series coefficient weights ($w_k$) may be varied limits or flexibility in setting them may not correct for all aging effects. Further, variations in the voltage provided from the power supply 208, either intentionally to provide gain control, or unintentionally can result in the need for the digital circuits storing and employing multiple power series.

Since typically predistortion circuits such as DSP predistortion amplifier circuit 200 do not have lossy elements after the power amplifier 203, with the exception of the splitter 204, the approach is power efficient. However, the DSP pre-distortion amplifier circuit 200 approach disclosed by Midya et al is atypical amongst predistortion circuit prior art in that it comprises a feed-back element of the predistortion circuitry. As such, the DSP pre-distortion amplifier circuit 200 can provide some limited adjustment in correction applied with variations in the power amplifier 203 performance, these being the power series coefficient weights, $w_k$. However, such techniques can still only cope with simple memoryless deterministic distortion, employ models that assume amplification distortion curves are static, and must employ models with either appropriate order of nonlinearity or number of entries within the loop-up table to provide correction over the range of operation of the power amplifier 203.

Alternative to performing feed forward or pre-distortion many have sought to provide distortion correction by directly feeding back the output signal to the input port of the power amplifier. Such an approach being shown in FIG. 3 wherein an RF signal to be amplified, $RF_{in}$, is applied to the input port 300A of an RF feedback circuit 300, and is electrically connected to the input splitter 310. The primary output port 310A of the input splitter is electrically connected to first port 320A of the summation circuit 320. The secondary output port 310B of the input splitter 310 is connected to the first port 380A of the delta generator circuit 380.

The output port of the summation circuit 320 is connected to the input port of the power amplifier 330, wherein it is amplified, and electrically coupled to the output port 300B of the RF feedback circuit 300 via the output tap coupler 340. The second output port of the output tap coupler 340 represents a predetermined portion of the output signal from the power amplifier 330 and is therefore an attenuated replica of the output signal, $RF_{out}$, at the output port 300B. The output signal being $RF_{out} = \Re(RF_{in})+\partial$, where $\Re(\ )$ represents the amplification process and $\partial$ represents distortion added by the power amplifier 330.

The second port of the output tap coupler 340 is then coupled to an attenuator 390 and electrically coupled to the second port 380B of the delta generator circuit 380. The attenuator 390 thereby further reducing the power of the replica of the output signal, $RF_{out}$, to approximately that of the tapped portion of the RF signal, $RF_{in}$. Accordingly the delta generator circuit 390 produces an output signal at output port 380C which essentially represents distortion generated within the power amplifier 330 as the input signal, $RF_{in}$, is subtracted from the tapped and attenuated replica of the output signal, $RF_{out}$.

This output signal $\partial \propto \langle RF_{out}-RF_{in}\rangle$ is then electrically coupled via the feedback arm 3100 to the second port 320B of the summation circuit 320. As a result the output signal from the summation circuit 320 is $SUM=RF_{in}-\partial$, such that the power amplifier 330 input signal is corrected for the distortion $\partial$ added during the amplification process $\Re(\ )$. The feedback arm 3100 comprises a feedback amplifier 370, which boosts the output signal $\partial$ to a level appropriate for summation with the input signal in the summation circuit 320, after which it is filtered by low pass filter 360 and phase shifted within the phase shifter circuit 350. The low pass filter 360 provides stability to the feedback circuit by reducing the gain of frequencies at which the phase around the feedback loop reaches zero, to below unity such that oscillation is suppressed. The phase shifter circuit 350 providing any additional phase shift to the feedback signal, the distortion $\partial$, such that within the operating frequency range of interest the signal applied to the summation node 320 is of the correct phase to cancel the distortion generated in the amplifier.

Figure 3:
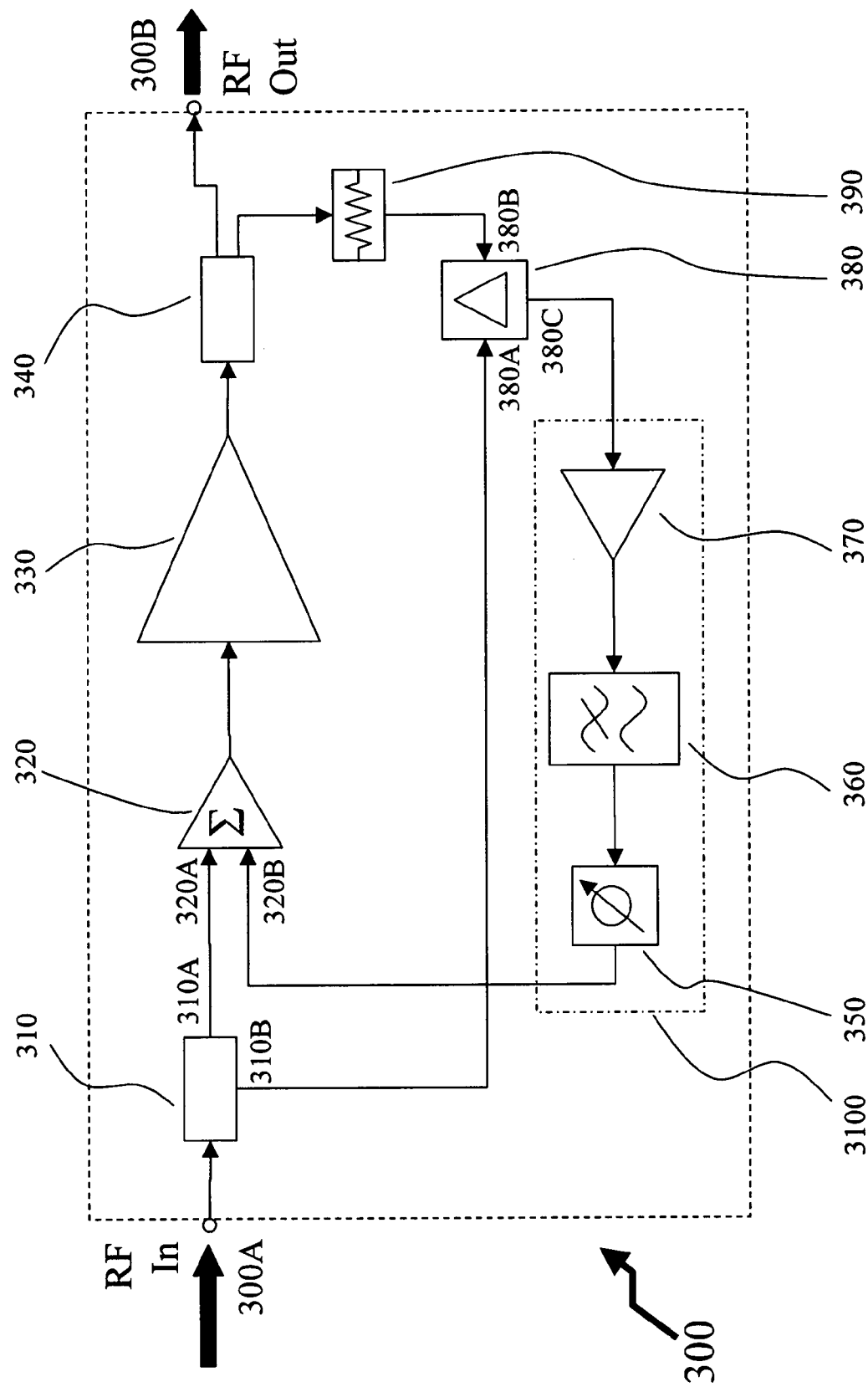
FIG. 3 illustrates an exemplary RF error feedback correction approach according to the prior art.

The RF feedback circuit 300 of FIG. 3 generates, manipulates and applies the RF feedback signal directly in the microwave domain, thereby providing a simple circuit implementation. An alternative approach, presented in FIG. 4 applies the distortion signal $\partial$ via modulation of the input signal, and within this example uses polar modulation to accomplish this. As shown, an RF signal $RF_{in}$ is applied to the input port 400A of a polar loop feedback circuit 400, and is electrically connected to the input splitter 410. The primary output port 410A of the input splitter 410 is electrically connected to the main signal arm 4100, and the tap output port 410B of the input splitter 410 is electrically connected to the polar loop feedback arm 4200, and provides the first signal into the polar loop feedback arm 4200. The first signal electrically coupled from the tap output port 410B is electrically connected to the first diode detector 470 and phase comparator 480. The main signal arm 4100 comprises variable attenuator 420 and variable phase modulator 425 electrically connected in series between the primary output port 410A and the power amplifier 430. The output port of the power amplifier 430 is then electrically connected to the output splitter 415. The output splitter 415 is electrically coupled to the output port 400B, thereby providing the amplified RF output signal, $RF_{out}$. The second port of the output splitter 415 provides the second signal into the polar loop feedback arm 4200.

The second port of the output splitter 415 is electrically connected to the feedback attenuator 460, the output port of which is electrically connected to the second diode detector 475 and phase comparator 480. The output signals from the first and second diode detectors 470 and 475 are electrically connected to the positive and negative input ports of differential amplifier 450, the output port of which is electrically coupled to the control port 420A of the variable attenuator via the first loop filter 440. As the first diode detector 470 detects the received RF signal $RF_{in}$, and the second diode detector 475 detects the amplified RF output signal, $RF_{out}$, the output signal from the differential amplifier 450 is directly determined by the error introduced by the power amplifier 430.

The output port from the phase comparator 480 is electrically connected to the control amplifier 455, and thence to the control port 425A of the variable phase modulator 425 via the second loop filter 445. As a result, the phase comparator 480 and differential amplifier 450, in conjunction with first and second diode detectors 470 and 475, provide for independent control of the amplitude and phase of the RF signal, $RF_{in}$, immediately prior to the power amplifier 430. In this manner, the polar loop feedback arm 4200 provides correction of the distortion introduced by power amplifier 430.

Figure 4:
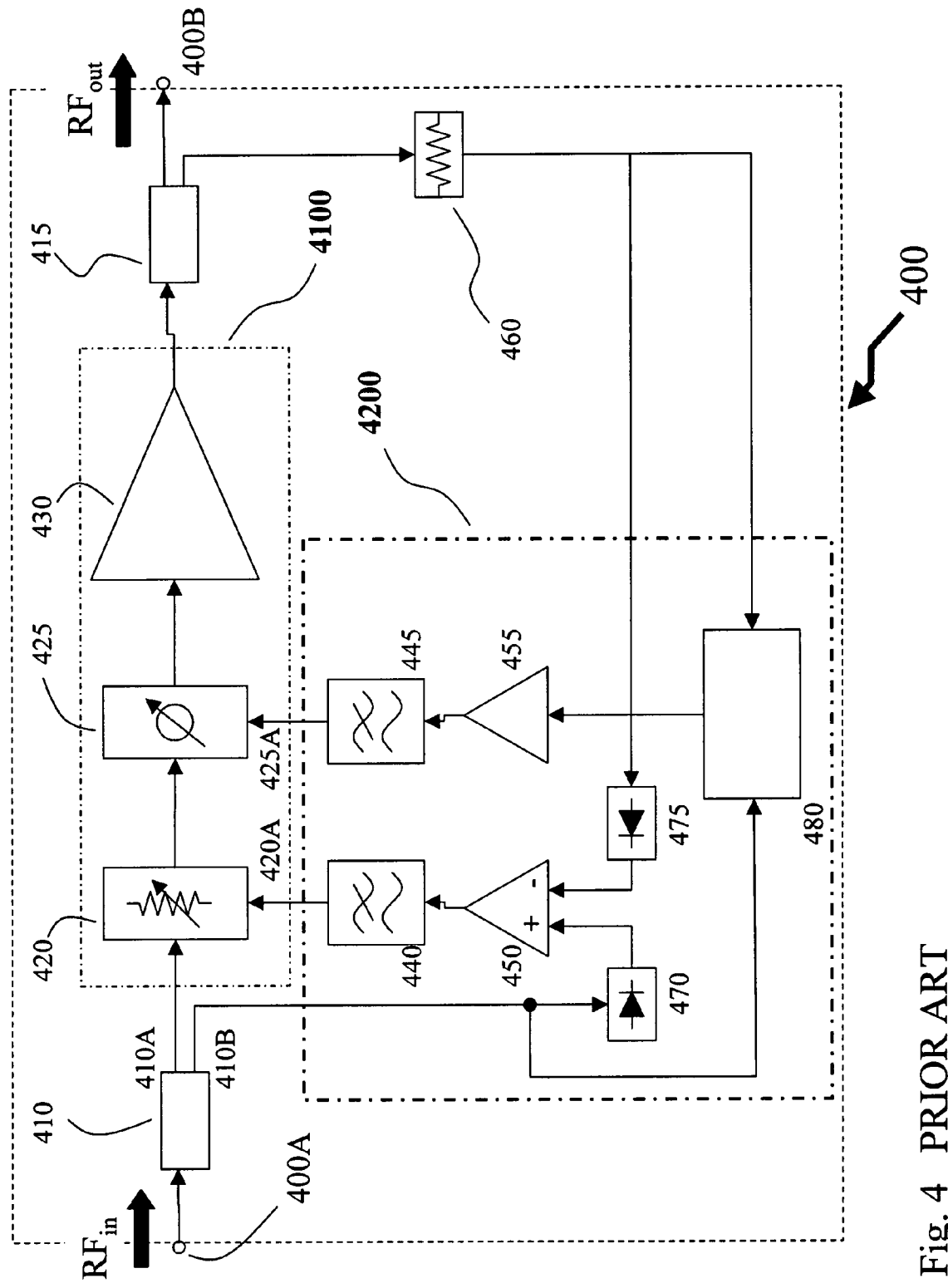
FIG. 4 illustrates an exemplary polar loop feedback distortion correction approach according to the prior art.
Figure 5:
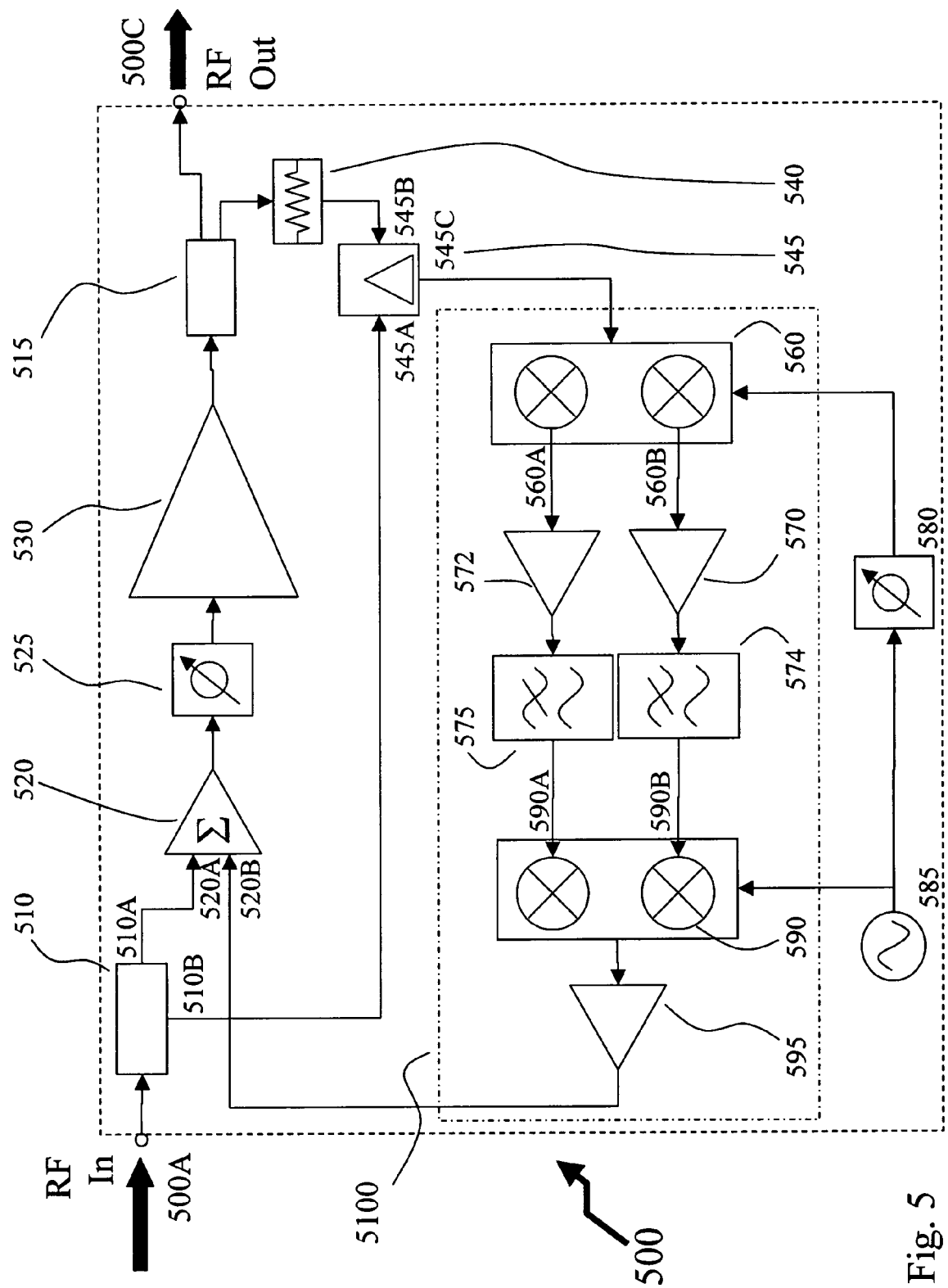
FIG. 5 illustrates a first exemplary embodiment of the invention providing distortion correction by RF feedback and baseband I and Q signal processing of the error signal.

According to the correction circuits presented supra in FIGS. 3 and 4 the bandwidth of the feedback correction circuits is determined substantially upon the delay within the feedback loop. As such, signal phase changes rapidly with frequency such that it is necessary to reduce the gain of the loop at frequencies wherein the phase shift would cause the loop to oscillate. As requirements for wider bandwidths arising from new systems become standard and evolve, such correction approaches will typically require a tradeoff in correction performance with bandwidth. Referring to FIG. 5 shown is an exemplary first embodiment of the invention wherein this tradeoff is modified such that wider bandwidths can be corrected whilst preserving the gain of the RF signal path through the amplifier.

As shown in FIG. 5, an RF signal to be amplified, $RF_{in}$, is applied to the input port 500A of an RF feedback circuit 500, and is electrically connected to the input splitter 510. The primary output port 510A of the input splitter 510 is electrically connected to first port 520A of the summation circuit 520. The secondary output port 510B of the input splitter 510 is connected to the first port 545A of the delta generator circuit 545.

The output port of the summation circuit 520 is connected to the input port of the power amplifier 530 via the first phase shifter circuit 525. The RF input signal, $RF_{in}$, is amplified by the power amplifier 530, and electrically coupled to the output port 500C of the RF feedback circuit 500 via the output tap coupler 515. The second output signal of the output tap coupler 515 represents a predetermined portion of the output signal from the power amplifier 530 and is therefore an attenuated replica of the output signal, $RF_{out}$, at the output port 500C. The output signal being $RF_{out} = \Re(RF_{in}) + \partial_{err}$, where $\Re( )$ represents the amplification process and $\partial_{err}$ represents distortion added by the power amplifier 530.

The second output port of the output tap coupler 515 is then coupled to an attenuator 540 and electrically coupled to the second port 545B of the delta generator circuit 545. The attenuator 540 thereby further reduces the power of the replica of the output signal, $RF_{out}$, to approximately that of the tapped portion of the RF signal, $RF_{in}$. Accordingly the delta generator circuit 545 produces an output signal at output port 545C which essentially represents distortion generated within the power amplifier 530 as the input signal, $RF_{in}$, is subtracted from the tapped and attenuated replica of the output signal, $RF_{out}$.

This output signal $\partial \approx \partial_{err} \propto (RF_{out} - RF_{in})$ is then electrically coupled to the feedback processing circuit 5100. The output signal $\partial$ is first coupled to the vector demodulator 560 that converts this output signal $\partial$ to I and Q baseband error signals $\partial_I$ and $\partial_Q$, which are output signals from I error port 560A and Q error port 560B, respectively. The I baseband error signal $\partial_I$ is electrically coupled via first baseband amplifier 572 before being filtered by first baseband filter 575 and coupled to the I input port 590A of the vector modulator 590. Similarly, the Q baseband error signal $\partial_Q$ is electrically coupled via second baseband amplifier 570 before being filtered by second baseband filter 574 and coupled to the Q input port 590B of the vector modulator 590. The output port of the vector modulator 590 is boosted by the error amplifier 595 before being electrically coupled to the second port 520B of the summation circuit 520. In this manner, the error signal $\partial$ generated by the power amplifier 530 is combined with the correct phase relationship to the RF signal to be amplified $RF_{in}$ to provide correction for operation of the power amplifier 530.

The local oscillator signal required by the vector demodulator 560 and vector modulator 590 is provided by the local oscillator 585. Whilst the local oscillator 585 is shown directly coupled to the vector modulator 590 it is electrically connected to the vector demodulator 560 via a second phase shifter circuit 580, which ensures the appropriate phase of the local oscillator signal to demodulate the I and Q signals $\partial_I$ and $\partial_Q$ respectively.

Fulfilling high loop gain, for high distortion suppression, whilst avoiding oscillation is challenging, as will be evident to one skilled in the art, because the amplifier may have several stages, and narrow band matching, so that the phase through the amplifier changes quickly with frequency, in other words, the amplifier may have significant delay. As such, stability of the feedback loop comprising substantially of the feedback processing circuit 5100 is provided by the first and second baseband filters 574 and 575 respectively, these reducing the overall gain of the feedback loop to below unity for frequencies wherein the phase shift around the feedback processing circuit 5100 and elements of the amplification path between the summation circuit 520 and delta generator circuit 545 is approximately zero. However, unlike prior art solutions these first and second baseband filters 574 and 575, respectively are only filtering the baseband error signal generated within the feedback processing circuit 5100. Beneficially, the critical design aspect of this filter is transformed from 'flatness of frequency response' to the provisioning of sharp cut-off allowing high in-band loop gain but rapid reduction in out-of-band gain as required to meet loop stability requirements.

Additionally, to successfully configure this amplifier, it is necessary to minimize the total loop delay so that the first and second baseband filters 574 and 575 can be provided with wide bandwidth since a wide loop filter allows correction over a wide bandwidth of signal, and maintain the loop gain sufficiently large enough to effect mid-band correction. This is particularly important with WiMAX and WiFi applications where channel bandwidths of 10 MHz and 20 MHz, respectively, are desired, such wide bandwidths thereby limiting overall loop delay. Benefit provided by the Cartesian error feedback circuit 500 increases according to the design attention in respect of minimizing this loop delay.

Whilst the exemplary embodiment of the invention has been presented with respect to a Cartesian error feedback method, alternatively other coordinate systems for the provision of baseband signals may be employed. As such, the error feedback approach of the invention may be applied to polar coordinate modulation formats, and optionally arbitrary coordinate modulation formats.

With WiMAX subscriber units having over 50 dB of dynamic range in output power, the PA within such units will typically operate from very low gain and output power, wherein the main power amplifier will typically be relatively linear, to high gain and high output power, wherein it will be typically highly non-linear. As such, there is benefit in operating the RF feedback circuit 500 in two or more modes of operation according to output power. Optionally, these modes may be switched according to other aspects of the system within which the RF feedback circuit 500 is embedded, such as managing power consumption in handheld devices. As such, at high output powers, with highly non-linear amplifier characteristics the RF feedback circuit 500 operates as presented in respect of the embodiment presented in respect of FIG. 5. At low output powers, where the power amplifier 530 has typically significantly improved linearity the feedback processor circuit 5100 along with the delta generator circuit 545, local oscillator 585 and second phase shift circuit 580 can be disabled by removing applied electrical power or by other means known in the art, such that the RF feedback circuit 500 now operates in an open-loop but with reduced power consumption. In instances where switching between modes is in a time that is shorter than the time that the local oscillator 585 can be stabilized it may be optionally left on in both modes.

Figure 6:
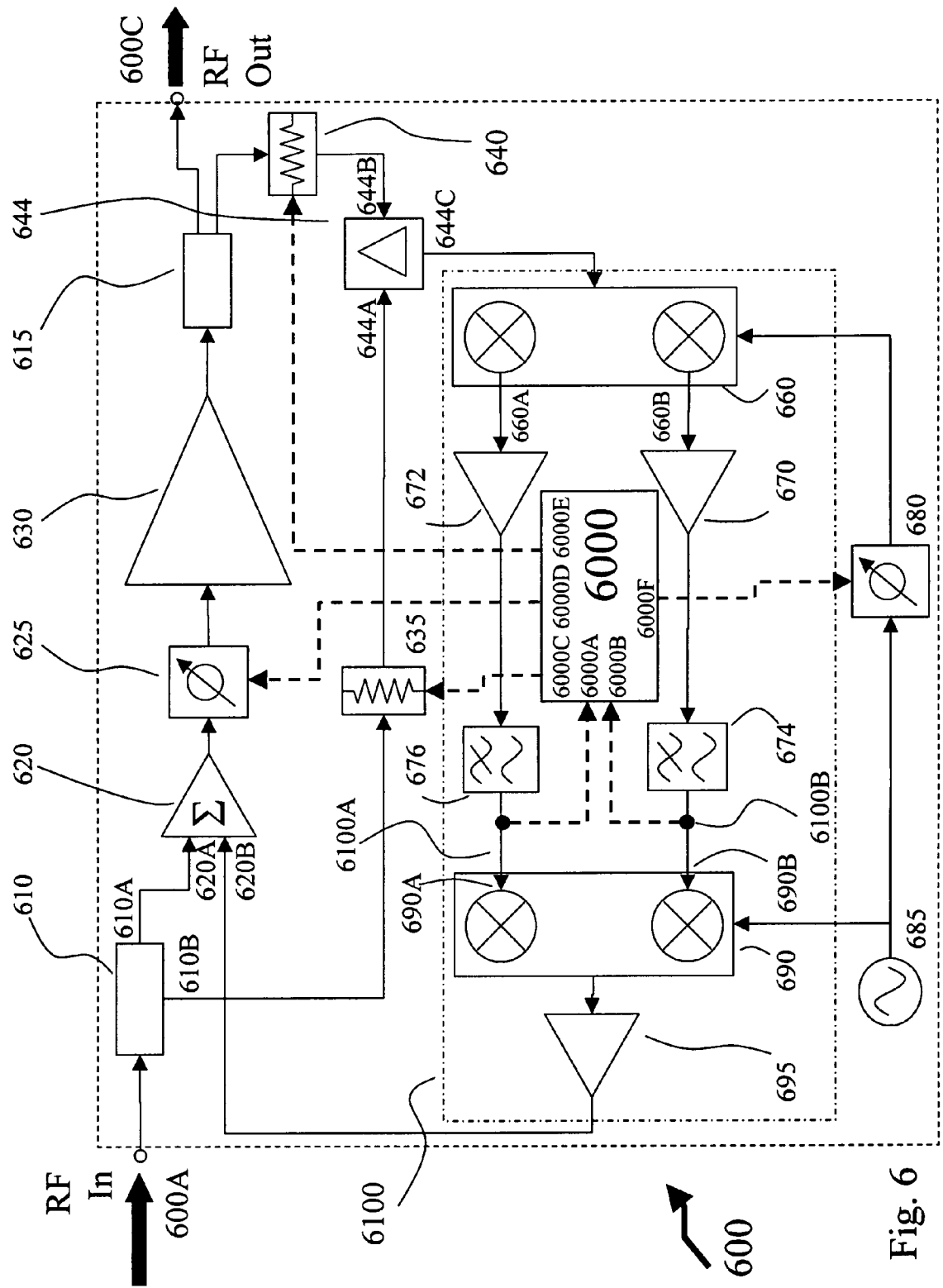
FIG. 6 illustrates a second exemplary embodiment of the invention providing distortion correction by RF feedback and baseband I and Q signal processing of the error signal operating over wide dynamic range and continuous control.

Referring to FIG. 6, illustrated is a second exemplary embodiment of the invention for an RF feedback circuit 600 are correctable. As shown in FIG. 6, an RF signal to be amplified, $RF_{in}$, is applied to the input port 600A of an RF feedback circuit 600, and is electrically connected to the input splitter 610. The primary output port 610A of the input splitter 610 is electrically connected to first port 620A of the summation circuit 620. The secondary output port 610B of the input splitter 610 is connected to the first port 644A of the delta generator circuit 644, via signal attenuator 674.

The output port of the summation circuit 620 is connected to the input port of the power amplifier 630 via the first phase shifter circuit 625. The RF input signal, $RF_{in}$, is amplified by the power amplifier 630, and electrically coupled to the output port 600C of the RF feedback circuit 600 via the output tap coupler 615. The second output port of the output tap coupler 615 represents a predetermined portion of the output signal from the power amplifier 630 and is therefore an attenuated replica of the output signal, $RF_{out}$, at the output port 600C. The output signal being $RF_{out} = \Re(RF_{in}) + \partial$, where $\Re( )$ represents the amplification process and $\partial$ represents distortion added by the power amplifier 630.

The second output port of the output tap coupler 615 is then coupled to an attenuator 640 and electrically coupled to the second port 644B of the delta generator circuit 644. The attenuator 640 thereby further reducing the power of the replica of the output signal, $RF_{out}$, to approximately that of the tapped portion of the RF signal, $RF_{in}$. Accordingly, the delta generator circuit 644 produces an output signal at output port 644C which essentially represents distortion generated within the power amplifier 630 as the input signal, $RF_{in}$, is subtracted from the tapped and attenuated replica of the output signal, $RF_{out}$.

This output signal $\partial \propto (RF_{out} - RF_{in})$ is then electrically coupled to the feedback processing circuit 6100. The output signal $\partial$ is first coupled to the vector demodulator 660 which converts this output signal $\partial$ to I and Q baseband error signals $\partial_I$ and $\partial_Q$, which are output signals from I error port 660A and Q error port 660B respectively. The I baseband error signal $\partial_I$ is electrically coupled via first baseband amplifier 672 before being filtered by first baseband filter 676 and coupled to the I input port 690A of the vector modulator 690. Similarly, the Q baseband error signal $\partial_Q$ is electrically coupled via second baseband amplifier 670 before being filtered by second baseband filter 674 and coupled to the Q input port 690B of the vector modulator 690. The output signal from the vector modulator 690 is boosted by the error amplifier 695 before being electrically coupled to the first port 620A of the summation circuit 620. This subtracts the error signal $\partial$ generated by the power amplifier 630 from the RF signal to be amplified $RF_{in}$ to provide correction for operation of the power amplifier 630.

The local oscillator signal required by the vector demodulator 660 and vector modulator 690 is provided by the local oscillator 685. Whilst the local oscillator 685 is shown directly coupled to the vector modulator 690, it is electrically connected to the vector demodulator 660 via a second phase shifter circuit 680, which ensures the appropriate phase of the local oscillator signal to demodulate the I and Q signals $\partial_I$ and $\partial_Q$ respectively.

Fulfilling high loop gain, for high distortion suppression, whilst avoiding oscillation is challenging, as will be evident to one skilled in the art, because the amplifier may have several stages, and narrow band matching, so that the phase through the amplifier changes quickly with frequency, in other words, the amplifier may have significant delay. As such, stability of the feedback loop is provided by the first and second baseband filters 674 and 676, these reducing the overall gain of the feedback loop to below unity for frequencies wherein the phase shift around the feedback loop from the output port of the power amplifier 530 through to its input port is approximately zero, thereby suppressing the oscillation of the feedback loop. However, unlike prior art solutions these first and second baseband filters 674 and 676, respectively, are only filtering the baseband error signal generated from the delta generator circuit 644 and converted to baseband by the vector demodulator 660. Beneficially, the critical design aspect of this filter is transformed from "flatness of frequency response" to the provisioning of sharp cut-off allowing high in-band loop gain but rapid reduction in out-of-band gain as required to meet loop stability requirements.

Whilst the exemplary embodiment of the invention has been presented in respect of FIG. 6 for the Cartesian error feedback method, alternatively other coordinate systems for the provision of baseband signals are employed. As such, the error feedback approach of the invention is applicable to polar coordinate modulation formats, and optionally arbitrary coordinate modulation formats. Further, as with the RF feedback circuit 500 of FIG. 5 the RF feedback circuit 600 can also support WiMAX subscriber units having over 50 dB of dynamic range in output power, the PA within such units will typically operate at low output power, wherein the main power amplifier is typically relatively linear, to high output power, wherein it is typically highly non-linear. As such, the RF feedback circuit 600 similarly optionally supports the two modes of operation presented supra in respect of the RF feedback circuit 500.

Further, the RF feedback circuit 600 supports localized control from the controller circuit 6000, as well as control from other elements of the device within which the RF feedback circuit 600 is operating. The controller circuit 6000 as shown receives input control signals at first and second control input ports 6000A and 6000B, respectively. The first control input port 6000A is electrically connected to first monitoring point 6100A, which is placed after the first baseband filter 676 on the I path of the feedback loop. As such, the first control input port 6000A receives an error signal $I_{err}$, where $I_{err} \propto \langle \partial \, \textcircled{x} \, f(LO) | \phi = \rangle$, and represents the in-phase portion of the baseband converted error signal $\partial$. Similarly, the second control input port 6000B is electrically connected to second monitoring point 6100B, which is placed after the second baseband filter 674 on the Q path of the feedback loop. As such, the second control input port 6000B receives an error signal $Q_{err}$, where $Q_{err} \propto \partial \otimes f(LO)|\phi=90$, and represents the quadrature portion of the baseband converted error signal $\partial$. Alternatively, the first and second monitoring points 6100A and 6100B may be placed before the first and second baseband filters 674 and 676.

Based upon these error signals $I_{err}$ and $Q_{err}$ the controller circuit 6000 determines the appropriate settings for control signals provided to several elements of the RF feedback circuit 600. A first set of control signals are provided from the controller outputs 6000C, 6000D and 6000E, the first controller output 6000C providing the control setting for the signal attenuator 635, the second controller output 6000D providing control of phase shifter 625 and the third controller output 6000E providing the control setting for the attenuator 640. The controller monitors the signals $I_{err}$ and $Q_{err}$ at its inputs 6000A/B and adjusts the three elements 674, 625 and 640 in order to minimize the power of $(I_{err}^2+Q_{err}^2)$. In this manner the controller circuit 6000 balances in both amplitude and phase the tapped portions of the applied RF signal $RF_{in}$ and output of the RF feedback circuit 600 being $RF_{out}$ fed to the delta generator circuit 644. The output signal 644C of the delta generator circuit 644 then contains a minimum component of the wanted signal, and consists predominantly of the error signal $\partial$.

The controller circuit 6000 also provides a control signal from controller output 6000F which provides the control setting for the second phase shifter circuit 680. Accordingly the controller circuit 6000 is able to control the phase shift of the local oscillator signal provided to the vector demodulator 660 and thereby adjusts the phase shift of the combined signal applied to the input of the power amplifier 630, $RF_{applied}=RF_{in}+\partial$ such that the feedback applied is in the correct phasing to improve the quality of the output $RF_{out}$ of the RF feedback circuit 600. The algorithm used to adjust 660 may be based on factory calibration, optionally using other known pieces of a-priori information such as, but not limited to, operating frequency; or by some other means.

The second exemplary embodiment of invention presented in respect of the RF feedback circuit 600 provides control of the first and second phase shifters 625 and 680, respectively, along with control of the attenuation settings of the signal attenuator 635 and attenuator 640. In order to minimize the distortion in the RF output signal 600C arising from the power amplifier 630, the controller circuit 6000 seeks to adjust the first phase shifter 625, signal attenuator 635, and attenuator 640 to null the signals detected at first and second monitoring points 6100A and 6100B. The controller circuit 6000 adjusts second phase shifter 680 for both increasing loop stability and to approximately optimize error cancellation.

Optionally, the controller circuit 6000 provides only control of some of these circuit elements, or alternatively may provide additional control such as providing control of the phase of the local oscillator 680 applied to the vector modulator 630, and an attenuator provided between the summation circuit 620 and power amplifier 630 (not shown for clarity). Additionally, the controller optionally establishes updates to different control loops at different rates, such as, for example, providing frequent updates of the phase of the local oscillator 680 applied to the vector demodulator 660 and infrequent updates to the signal attenuator 635 and attenuator 640.

Optionally, the controller circuit 6000 receives additional input control signals such as a transmit enable, therein providing the controller circuit 6000 with information as to status of the transmitter to which the RF feedback circuit 600 is connected. This information allows timing for controlling adjustment triggers, implementing adjustments of power level, or enabling the provisioning of a dedicated test signal such as outlined supra to be established by the controller circuit 6000. Alternatively, the controller circuit 6000 optionally receives a power setting signal indicating the intended target output power of the RF signal provided at the output port 600C, $RF_{out}$ Numerous other embodiments may be envisaged without departing from the spirit or scope of the invention.

What is claimed is:

1. A method comprising:
    amplifying an applied RF input signal to generate an RF output signal with an amplifier;
    generating an error signal by combining a predetermined portion of the RF output signal with a predetermined portion of a supplied RF input signal;
    modifying the error signal to generate a modified error signal, the modified error signal generated by down-converting the error signal, processing the down-converted error signal and up-converting the processed down-converted error signal;
    reducing distortion in the RF output signal by combining the modified error signal with the supplied RF input signal to provide the applied RF input signal; and
    controlling an aspect of at least one of the generation of the modified error signal, generation of the error signal, and the applied RF input signal at least in dependence upon a magnitude of the down-converted error signal.

2. A method according to claim 1 wherein,
    processing the down-converted error signal comprises modifying at least one of a time delay, an amplitude, and a phase of at least a predetermined baseband portion of the down-converted error signal.

3. A method according to claim 1 wherein,
    controlling an aspect of the at least one of the generation of the modified error signal, generation of the error signal, and the applied RF input signal at least in dependence upon a magnitude of the down-converted error signal comprises adjusting the phase of an oscillator providing an oscillator signal employed in at least one of down-converting the error signal and up-converting the processed down-converted error signal.

4. A method according to claim 1 wherein,
    controlling an aspect of the at least one of the generation of the modified error signal, generation of the error signal, and the applied RF input signal at least in dependence upon a magnitude of the down-converted error signal comprises modifying at least one of a time delay, an amplitude, and a phase of the predetermined portion of the supplied RF input signal and the predetermined portion of the RF output signal.

5. A method according to claim 1 wherein,
    processing the down-converted error signal comprises filtering the down-converted error signal.

6. A method according to claim 5 wherein,
    filtering the baseband error signal comprises filtering with a low pass filter, the low pass filter characterized by at least a cutoff frequency, wherein the cutoff frequency multiplied by the time delay from an output port of the amplifier to an input port of the amplifier is less than is 25 MHz.ns.

7. A method according to claim 1 wherein,
    controlling comprises controlling irrespective of the content of the applied RF signal.

8. A method according to claim 1 wherein,
    controlling comprises controlling when the applied RF signal comprises data to be transmitted.

9. A circuit comprising:

an amplifier for amplifying an applied RF input signal to generate an RF output signal;

an error signal circuit for generating an error signal by combining a predetermined portion of the RF output signal with a predetermined portion of a supplied RF input signal;

an error signal modification circuit for modifying the error signal to generate a modified error signal, the modified error signal generated by down-converting the error signal, processing the down-converted error signal and up-converting the processed down-converted error signal;

an error combiner circuit for reducing distortion in the RF output signal by combining the modified error signal with the supplied RF input signal to provide the applied RF input signal; and a controller for controlling an aspect of at least one of the generation of the modified error signal, generation of the error signal, and the applied RF input signal at least in dependence upon a magnitude of the down-converted error signal.

10. A method comprising;

(a) amplifying a microwave signal with at least an amplifier to provide an output signal, the output signal being substantially an amplified replica of the microwave signal;

(b) providing an input signal, the input signal forming a portion of the microwave signal to be amplified;

(c) extracting a predetermined portion of the output signal;

(d) combining a predetermined portion of the input signal with the predetermined portion of the output signal to form an error signal, the error signal substantially suppressing the input signal component and substantially unaffecting distortion components of the output signal;

(e) down-converting the error signal according to a predetermined coordinate system to provide down-converted error components;

(f) processing the down-converted error components to provide modified down-converted error components;

(g) up-converting the modified down-converted error components according to the predetermined coordinate system to provide a modified error signal;

(h) combining the modified error signal with the input signal to form the microwave signal and provide a reduction in the distortion components of the output signal; and (i) providing at least a control signal, the control signal being one of a plurality of control signals, each control signal for controlling an aspect of at least one of steps (a) through (h) and being determined in dependence upon a measure of one of the down-converted error components and modified down-converted error components.

11. A method according to claim 10 wherein, controlling an aspect of at least one of steps (a) through (h) comprises controlling an aspect of at least one of amplifying the microwave signal, generating the predetermined portion of the input signal, extracting the predetermined portion of the output signal, down-converting the error signal, up-converting the modified down-converted error components and processing the down-converted error components.

12. A method according to claim 10 wherein, step (h) comprises determining the control signal irrespective of the content of the input signal.

13. A method according to claim 10 wherein, step (h) comprises determining the control signal when the input signal represents live traffic.

14. A method according to claim 10 wherein, step (h) further comprises determining the control signal in dependence upon a first mode of operation of the amplifier when processing live traffic and a second mode of operation when other than processing live traffic.

15. A method according to claim 14 wherein, determining the control signal in the second mode operation comprises at least one of maintaining the control signal at a value established from the first mode of operation and providing a predetermined test signal as the input signal and determining the control signal by nulling a magnitude of the down-converted error components.

16. A method according to claim 10 comprising;

performing steps (e) through (g) in a first mode of operation; and other than performing steps (e) through (g) in a second mode of operation.

17. A method according to claim 16 wherein, other than performing steps (e) through (g) comprises at least one of deactivating a predetermined portion of a circuit implementing the method and reducing a supply voltage to a predetermined portion of a circuit implementing the method to a predetermined value.

18. A method according to claim 16 wherein, determining the mode of operation comprises determining the mode of operation in dependence of at least one of a target output power of the amplifier and a target power consumption of a circuit of which the amplifier forms part thereof.

19. A method according to claim 10 wherein, providing at least a control signal comprises providing a control signal for controlling the phase of an oscillator signal for use in at least one of step (e) and step (g).

20. A method according to claim 10 wherein, providing at least a control signal comprises providing a control signal for controlling at least one of the power and phase of the microwave signal, the power of predetermined portion of the input signal, and power of the predetermined portion of the output signal.

21. A method according to claim 10 wherein, providing at least a control signal comprises providing a first control signal for controlling the power of the microwave signal and a second control signal for controlling the power of the predetermined portion of the output signal, the first and second control signals for maintaining the power of the microwave signal and the power of the predetermined portion of the output signal according to a predetermined relationship.

22. A method according to claim 10 comprising;

reducing distortion in the output signal by repeating step (i) and determining for each step (i) the at least a control signal so as to minimize the measure of the down-converted error components.

23. A method according to claim 10 comprising, increasing linearity of the amplification by repeating step (i) and determining for each step (i) the at least a control signal so as to minimize the measure of the down-converted error components.

24. A method according to claim 10 wherein, down-converting the error signal according to a coordinate system comprises down-converting according to standard modulation format, the modulation format being at least one of quadrature modulation, polar modulation, and modulation in a predetermined coordinate system.

25. A method according to claim 10 wherein,
providing at least a control signal comprises providing a first control signal for controlling the power of the predetermined portion of the input signal and a second control signal for controlling the power of the predetermined portion of the output signal, the first and second control signals for increasing suppression of the input signal component and increasing the power of the distortion components in step (d).

26. A method according to claim 10 wherein,
step (h) comprises processing the modified error signal prior to combining it with the input signal.

27. A method according to claim 10 wherein,
processing a down-converted error component comprises at least one of adjusting the phase of the down-converted error component, adjusting the amplitude of the down-converted error component, and filtering the down-converted error component.

28. A method according to claim 27 wherein,
filtering the down-converted error component comprises filtering the down-converted error component with a low pass filter, the low pass filter characterized by at least a cutoff frequency, the product of the cutoff frequency, in MHz, multiplied by the time delay, in ns, of steps (d) through (g) is less than 25 MHz.ns.

29. A method according to claim 10 wherein,
step (h) comprises delaying the input signal prior to combining it with the modified error signal, the delay being approximately that of steps (a) and steps (d) through (g).

30. A method according to claim 10 wherein,
executing steps (a) through (i) is by using at least a semiconductor integrated circuit.

31. A method according to claim 10 wherein,
executing steps (a) through (i) comprises;
providing an electrical circuit;
providing a first predetermined portion of the electrical circuit as portion of a first integrated circuit;
providing a second predetermined portion of the electrical circuit as a portion of a second integrated circuit; and
assembling the first and second integrated circuits, the assembly minimizing the time delay from the amplifier output port to the amplifier input port in executing steps (a) and steps (c) through (h).

32. A method according to claim 10 wherein,
executing steps (a) through (h) comprises;
providing an electrical circuit;
providing a first predetermined portion of the electrical circuit as a portion of a first circuit package;
providing a second predetermined portion of the electrical circuit as a portion of a second circuit package; and
assembling the first and second circuit packages, the assembly reducing the time delay from the amplifier output port to the amplifier input port in executing steps (a) and steps (c) through (h).

33. A method according to claim 32 comprising;
providing a predetermined portion of the electrical circuit as a portion of its respective circuit package comprises placing the respective portion of the electrical circuit within the circuit package to reduce the time delay associated with the portion of the electrical circuit and its respective circuit package.

* * * * *